(12) United States Patent
Banine et al.

(10) Patent No.: US 8,405,051 B2
(45) Date of Patent: Mar. 26, 2013

(54) METHOD FOR REMOVING A DEPOSITION ON AN UNCAPPED MULTILAYER MIRROR OF A LITHOGRAPHIC APPARATUS, LITHOGRAPHIC APPARATUS AND DEVICE MANUFACTURING METHOD

(75) Inventors: Vadim Yevgenyevich Banine, Deurne (NL); Maarten Marinus Johannes Wilhelmus Van Herpen, Heesch (NL); Wouter Anthon Soer, Nijmwegen (NL); Martin Jacobus Johan Jak, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 218 days.

(21) Appl. No.: 12/997,149

(22) PCT Filed: Jun. 9, 2009

(86) PCT No.: PCT/EP2009/057097
§ 371 (c)(1),
(2), (4) Date: Dec. 9, 2010

(87) PCT Pub. No.: WO2010/006847
PCT Pub. Date: Jan. 21, 2010

(65) Prior Publication Data
US 2011/0117504 A1    May 19, 2011

Related U.S. Application Data

(60) Provisional application No. 61/077,066, filed on Jun. 30, 2008, provisional application No. 61/136,910, filed on Oct. 14, 2008.

(51) Int. Cl.
*G03F 7/20* (2006.01)

(52) U.S. Cl. ............... 250/492.2; 250/504 R; 134/2; 134/21; 134/26

(58) Field of Classification Search ............ 250/492.2, 250/504 R; 134/2, 21, 26
See application file for complete search history.

(56) References Cited

U.S. PATENT DOCUMENTS

| 7,561,247 B2 * | 7/2009 | Van Herpen et al. ............ 355/30 |
| 7,875,863 B2 * | 1/2011 | Van Herpen et al. ......... 250/492.2 |
| 2007/0040999 A1 | 2/2007 | Van Herpen et al. |

FOREIGN PATENT DOCUMENTS

| DE | 10 2005 03232 | 1/2007 |
| WO | 2008/002134 | 1/2008 |
| WO | 2009/121385 | 10/2009 |

OTHER PUBLICATIONS

International Search Report as issued for PCT/EP2009/057097, dated Nov. 20, 2009.
Chinese Office Action dated Jun. 26, 2012 in corresponding Chinese Patent Application No. 200980125562.6.

* cited by examiner

*Primary Examiner* — Kiet T Nguyen
(74) *Attorney, Agent, or Firm* — Pillsbury Winthrop Shaw Pittman LLP

(57) ABSTRACT

A method for removal of a deposition on an uncapped multilayer mirror of an apparatus. The method includes providing a gas that includes one or more of $H_2$, $D_2$, and DH, and one or more additional compounds selected from hydrocarbon compounds and/or silane compounds in at least part of the apparatus; producing hydrogen and/or deuterium radicals and radicals of the one or more additional compounds, from the gas; and bringing the uncapped multilayer mirror with deposition into contact with at least part of the hydrogen and/or deuterium radicals and the radicals of the one or more additional compounds to remove at least part of the deposition.

10 Claims, 4 Drawing Sheets

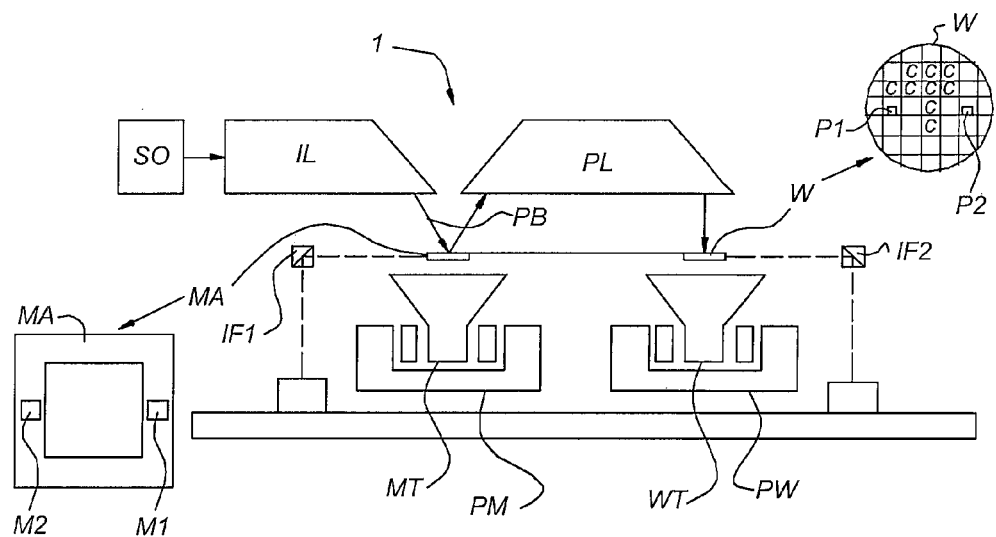
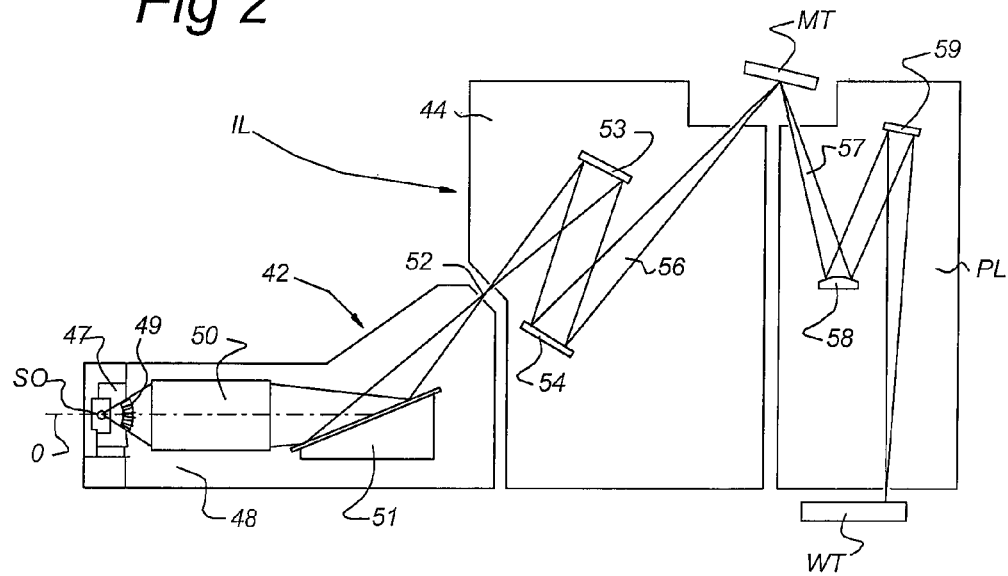

METHOD FOR REMOVING A DEPOSITION ON AN UNCAPPED MULTILAYER MIRROR OF A LITHOGRAPHIC APPARATUS, LITHOGRAPHIC APPARATUS AND DEVICE MANUFACTURING METHOD

CROSS-REFERENCE TO RELATED APPLICATIONS

This application is the National Phase entry of PCT/EP2009/057097, which claims the benefit of priority from U.S. Provisional Patent Application No. 61/077,066, filed Jun. 30, 2008, and U.S. Provisional Patent Application No. 61/136,910, filed Oct. 14, 2008, both of which are incorporated herein by reference in their entireties.

FIELD

The present invention relates to a method for removing a deposition on an uncapped multilayer mirror of a lithographic apparatus, a lithographic apparatus, and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that example, a patterning device, which is alternatively referred to as a mask or a reticle, may be used to generate a circuit pattern to be formed on an individual layer of the IC. This pattern can be transferred onto a target portion (e.g. including part of one or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture $NA_{PS}$ or by decreasing the value of $k_1$.

In order to shorten the exposure wavelength and, thus, reduce the minimum printable size, it has been proposed to use an extreme ultraviolet (EUV) radiation source. EUV radiation sources are configured to output a radiation wavelength of about 13 nm. Thus, EUV radiation sources may constitute a significant step toward achieving small features printing. Such radiation is termed extreme ultraviolet or soft x-ray, and possible sources include, for example, laser-produced plasma sources, discharge plasma sources, or synchrotron radiation from electron storage rings. Along with useful EUV in-band radiation, EUV radiation sources may produce almost equal (and sometimes more) undesirable out-of-band infrared ("IR") and deep ultraviolet ("DUV") radiation.

The source of EUV radiation is typically a plasma source, for example a laser-produced plasma or a discharge source. A common feature of any plasma source is the inherent production of fast ions and atoms, which are expelled from the plasma in all directions. These particles can be damaging to the collector and condenser mirrors which are generally multilayer mirrors, with fragile surfaces. These surfaces are gradually degraded due to the impact, or sputtering, of the particles expelled from the plasma and the lifetime of the mirrors is thus decreased. The sputtering effect may be particularly problematic for the collector mirror. The purpose of this mirror is to collect radiation which is emitted in all directions by the plasma source and direct it towards other mirrors in the illumination system. The collector mirror is positioned very close to, and in line-of-sight with, the plasma source and therefore receives a large flux of fast particles from the plasma. Other mirrors in the system are generally damaged to a lesser degree by sputtering of particles expelled from the plasma since they may be shielded to some extent.

Extreme ultraviolet (EUV) sources may use tin (Sn) or another metal vapor to produce EUV radiation. With such EUV sources, Sn may be discharged or deposited on the EUV collector. In order to achieve sufficient lifetime for the EUV lithographic apparatus, it is desirable to remove tin from the EUV collector.

Hydrogen radicals may be used to remove Sn and other contamination from optical elements, as described in United States patent application publication no. 2006/0115771. A cleaning rate greater than about 1 nm/sec with $H_2$ radicals may be obtained when Sn contamination is deposited on a Si substrate. However, experiments on Ru substrates have shown that the cleaning rate with $H_2$ radicals is a lot lower than on Si substrates and full cleaning of Ru substrates (i.e. all Sn removed from the Ru substrate) may not be possible.

One option that may be pursued fully to remove Sn deposition on a Ru substrate is to add a capping layer to the multi-layer mirror surface. In United States patent application publication no. 2006/0115771 describes the use of such a capping layer to protect various optical elements. With such a process, it may be possible fully to clean a multi-layer optical element with Ru-top, Mo-top or Si-top, using hydrogen plasma.

SUMMARY

It is desirable to provide a method for removing Sn depositions from uncapped multilayer mirrors, particularly for use with laser-produced plasma (LPP) sources.

In an aspect of the invention, there is provided method for removal of a deposition comprising Sn on an uncapped Mo/Si multilayer mirror of an apparatus, the method comprising: providing a gas comprising one or more of $H_2$, $D_2$ and HD and one or more additional compounds selected from hydrocarbon compounds and/or silane compounds in at least part of the apparatus; producing hydrogen and/or deuterium radicals and radicals of the one or more additional compounds, from the gas; and bringing the uncapped Mo/Si multilayer mirror with deposition into contact with at least part of the hydrogen and/or deuterium radicals and radicals of the one or more additional compounds to remove at least part of the deposition.

In another aspect of the invention, there is provided a device manufacturing method comprising: conditioning a radiation beam using a radiation system, the radiation system including at least one uncapped Mo/Si multilayer mirror; patterning the radiation beam with a desired pattern to form a patterned beam of radiation; projecting the patterned beam of radiation onto a substrate; and during or after the conditioning, removing a deposition comprising Sn on the at least one uncapped Mo/Si multilayer mirror, the removing comprising: providing a gas comprising one or more of $H_2$, $D_2$ and HD and one or more additional compounds selected from hydrocarbon compounds and/or silane compounds; producing hydrogen and/or deuterium radicals and radicals of the one or more additional compounds, from the gas; and bringing the uncapped Mo/Si multilayer mirror with deposition into contact with at least part of the hydrogen and/or deuterium radicals and radicals of the one or more additional compounds to remove at least part of the deposition.

In yet another aspect of the invention, there is provided a lithographic apparatus comprising: an uncapped Mo/Si multilayer mirror; and a cleaning apparatus configured to remove a deposition comprising Sn on the uncapped Mo/Si multilayer mirror, the cleaning apparatus being configured to provide a gas comprising one or more of $H_2$, $D_2$ and HD and one or more additional compounds selected from hydrocarbon compounds and/or silane compounds in at least part of the lithographic apparatus, to produce hydrogen and/or deuterium radicals and radicals of the one or more additional compounds, from the gas, and to supply the hydrogen and/or deuterium radicals and radicals of the one or more additional compounds to the uncapped Mo/Si multilayer mirror to remove at least part of the deposition.

BRIEF DESCRIPTION OF THE DRAWINGS

Embodiments of the present invention will now be described, by way of example only, with reference to the accompanying schematic drawings in which corresponding reference symbols indicate corresponding parts, and in which:

FIG. 1 schematically depicts a lithographic apparatus according to an embodiment of the invention;

FIG. 2 schematically depicts a side view of an EUV illumination system and projection optics of a lithographic projection apparatus according to FIG. 1;

DETAILED DESCRIPTION

Figure 3:
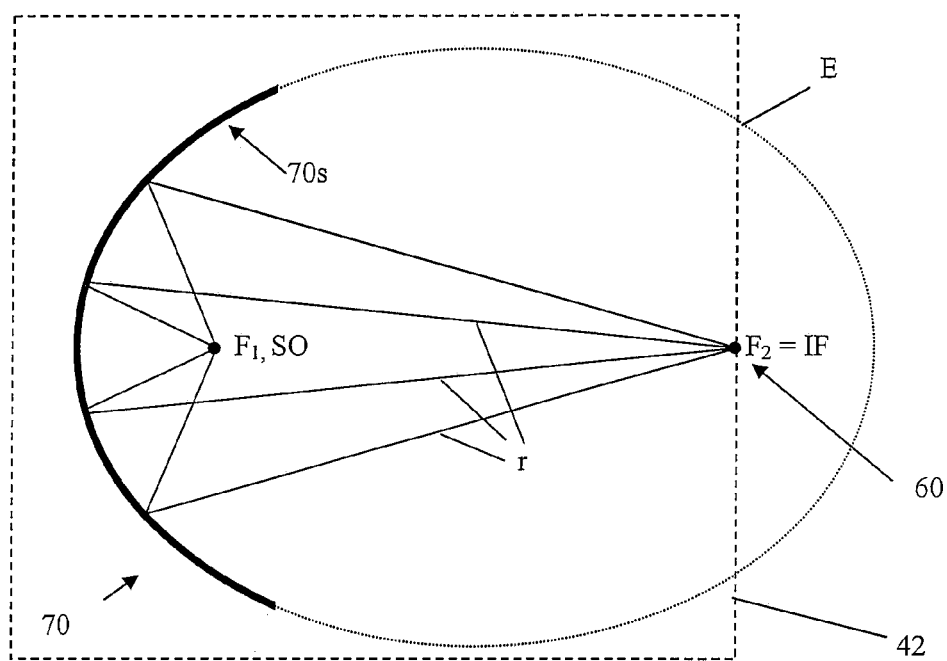
FIG. 3 depicts a radiation source and a normal incidence collector in accordance with an embodiment of the invention.

FIG. 1 schematically depicts a lithographic apparatus 1 according to an embodiment of the present invention. The apparatus 1 includes an illumination system (illuminator) IL configured to condition a radiation beam PB (e.g. UV radiation or EUV radiation). A pattern support (e.g. a mask table) MT is configured to support a patterning device (e.g. a mask) MA and is connected to a first positioning device PM configured to accurately position the patterning device in accordance with certain parameters. A substrate table (e.g. a wafer table) WT is configured to hold a substrate (e.g. a resist-coated wafer) W and is connected to a second positioning device PW configured to accurately position the substrate in accordance with certain parameters. A projection system (e.g. a refractive projection lens system) PL is configured to project the patterned radiation beam PB onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The pattern support MT holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system.

Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type, for example employing a reflective mask. Alternatively, the apparatus may be of a transmissive type, for example employing a transmissive mask.

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather that liquid is located, for example, between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a delivery system including, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may include an adjusting device (not shown in FIG. 1) configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser (not shown in FIG. 1). The illuminator may be used to condition the radiation beam, to have a desired uniformity and intensity distribution in its cross-section.

The radiation beam PB is incident on the patterning device (e.g., mask) MA, which is held on the pattern support (e.g., mask table) MT, and is patterned by the patterning device. After being reflected by the patterning device (e.g. mask) MA, the radiation beam PB passes through the projection system PL, which focuses the beam onto a target portion C of the substrate W. With the aid of the second positioning device PW and a position sensor IF2 (e.g. an interferometric device, linear encoder or capacitive sensor), the substrate table WT can be moved accurately, e.g. so as to position different target portions C in the path of the radiation beam PB. Similarly, the first positioning device PM and a position sensor IF1 (e.g. an interferometric device, linear encoder or capacitive sensor) can be used to accurately position the patterning device (e.g. mask) MA with respect to the path of the radiation beam PB, e.g. after mechanical retrieval from a mask library, or during a scan. In general, movement of the patterning device (e.g. mask table) MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper, as opposed to a scanner, the pattern support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions. These are known as scribe-lane alignment marks. Similarly, in situations in which more than one die is provided on the patterning device (e.g. mask) MA, the patterning device alignment marks may be located between the dies.

The depicted apparatus could be used in at least one of the following modes:

1. In step mode, the pattern support (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the pattern support (e.g. mask table) MT and the substrate table WT are scanned synchronously while a pattern imparted to the radiation beam is projected onto a target portion C (i.e. a single dynamic exposure). The velocity and direction of the substrate table WT relative to the pattern support (e.g. mask table) MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the pattern support (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The term "lens", where the context allows, may refer to any one or combination of various types of optical components, including refractive, reflective, magnetic, electromagnetic and electrostatic optical components.

In the context of the present invention, "optical element" includes one or more elements selected from optical filters, optical gratings, mirrors such as multilayer mirrors, grazing incidence mirrors, normal incidence mirrors, collector mirrors, etc, lenses, reticles, diodes, sensors such as intensity measurements sensors, energy sensors, CCD sensors, alignments sensors such as optical alignment sensors, gas barrier structures, for example as described in U.S. Pat. Nos. 6,614,505 and 6,359,969, which are incorporated herein by reference, etc. Such optical elements, such as filters, gratings, mirrors or lenses may be flat or curved and may be present as layer, foil, device etc. In an embodiment of the present invention, optical elements such as optical filters, optical gratings, mirrors, like multilayer mirrors, grazing incidence mirrors, normal incidence mirrors, collector mirrors, lenses, etc., may be blazed or optimized for radiation with a predetermined wavelength λ (like 5-20 nm, i.e. EUV radiation, 248 nm, 193 nm, 157 nm or 126 nm, etc). They may also be transmissive to radiation with wavelengths λ in the case of lenses, or reflective in the case of mirrors, or diffractive in the case of gratings. Some optical elements may provide one or more of these optical effects, see for example European Patent application no. 03077155 and European Patent application no. 03077850, which are incorporated herein by reference.

The term "layer" as used herein, as understood by those of ordinary skill in the art, may describe layers having one or more boundary surfaces with other layers and/or with other media such as vacuum in use. However, it should be understood that "layer" may also mean part of a structure. The term "layer" may also indicate a number of layers. These layers can be, for example, next to each other or on top of each other, etc. They may also include one material or a combination of materials. It should also be noted that the term "layers" used herein may describe continuous or discontinuous layers. In the present invention, the term "material" used herein may also be interpreted as a combination of materials. The term "deposition" herein refers to material that is chemically or physically attached to a surface (e.g. the surface of an optical element), as known to those of ordinary skill in the art. Such deposition may be a layer, but it may also include a multilayer structure. The deposition may include deposits like sputtered (elemental) particles from a source. The deposition may also include redeposition products or evaporation products.

The term "uncapped multilayer mirror" as used herein describes a periodic multilayer structure consisting of a plurality of periods of a repeating unit. The repeating unit consists of two or more different layers. The periodic multilayer structure terminates with one of the layers of the repeating unit. That is to say, the external layer of the multilayer mirror is one of the layers of the repeating unit. Thus, multilayer mirrors as used herein are uncapped structures. Preferred layers of the repeating unit are a Mo layer, a Si layer and a diffusion barrier layer. Thus, the top layer of the multilayer mirror is preferably either Mo, Si or a diffusion barrier. The diffusion barrier layer is a layer that is placed between each Mo and Si layer, to prevent mixing of the Mo and Si layers. In one embodiment of the present invention the repeating unit has the following layers:

[Mo-diffusion barrier-Si-diffusion barrier]

The multilayer mirror of the present invention is therefore preferably an uncapped Mo/Si multilayer mirror. The multilayer mirror preferably has 40 or more periods of the repeating unit, more preferably 50 or more periods of the repeating unit and most preferably 60 or more periods of the repeating unit.

The terms "radiation" and "beam" as used herein encompass all types of electromagnetic radiation, including ultraviolet (UV) radiation (e.g. having a wavelength λ of 365, 248, 193, 157 or 126 nm) and extreme ultra-violet (EUV or soft X-ray) radiation (e.g. having a wavelength in the range of 5-20 nm), as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths which can be produced by a mercury discharge lamp: G-line 436 nm; H-line 405 nm; and/or I-line 365 nm. VUV is Vacuum UV (i.e. UV absorbed by air) and refers to wavelengths of approximately 100-200 nm. DUV is Deep UV, and is usually used in lithography for the wavelengths produced by excimer lasers like 126 nm-248 nm. As will be understood by those of ordinary skill in the art, radiation having a wavelength in the range of e.g. 5-20 nm relates to radiation with a certain wavelength band with, of which at least part of it is found in the range of 5-20 nm.

The phrase "providing a gas comprising one or more additional compounds selected from hydrocarbon compounds and/or silane compounds in at least part of the apparatus" describes the deliberate introduction of a hydrocarbon compound or a silane compound or both these compounds. Here, "compound" refers to a gas or a liquid, not to one specific molecule. In case of a liquid, in an embodiment, the compound is introduced in the apparatus as gaseous compound, e.g. by a (pre)heating, or is vaporized within the apparatus, e.g. lithographic apparatus, or is introduced after decomposition in the apparatus or is decomposed within the apparatus. In one embodiment, the boiling temperature of the hydrocarbon or silane compound is below 773 K; in a further embodiment the boiling temperature of the hydrocarbon or silane compound is below 623 K; in an embodiment, the boiling temperature of the hydrocarbon or silane compound is below 523 K; in an embodiment the boiling temperature of the hydrocarbon or silane compound is below 423 K (150° C.). The term "group" or "side chain" or "side group" are synonyms. For example, trimethyl silane ($HSi(CH_3)_3$) is a silicon including one hydrogen group (H) and three methyl groups, or e.g. iso-butane includes propane with 1 methyl side group or side chain. The term $C_1$-$C_6$, etc., refer to hydrocarbons or hydrocarbon side chains, like $C_1$ (i.e. $CH_4$ compound or $CH_3$ side chain), $C_2$ (ethane), $C_3$ (propane), $C_4$ (butane), $C_5$ (pentane), $C_6$, (hexane), etc., and their isomers.

FIG. 2 shows the projection apparatus 1 in more detail, including a radiation system 42, an illumination optics unit 44, and the projection system PL. The radiation system 42 includes the radiation source SO which may be formed by a discharge plasma. EUV radiation may be produced by a gas or vapor, such as Xe gas, Li vapor or Sn vapor in which a very hot plasma is created to emit radiation in the EUV range of the electromagnetic spectrum. The very hot plasma is created by causing a partially ionized plasma of an electrical discharge to collapse onto an optical axis O. Partial pressures of 10 Pa of Xe, Li, Sn vapor or any other suitable gas or vapor may be required for efficient generation of the radiation. The radiation emitted by radiation source SO is passed from a source chamber 47 into a collector chamber 48 via a gas barrier structure or contamination trap 49 which is positioned in or behind an opening in source chamber 47. The gas barrier structure/contamination trap 49 includes a channel structure such as, for example, described in detail in U.S. Pat. Nos. 6,614,505 and 6,359,969.

The collector chamber 48 includes a radiation collector 50 which may be formed by a grazing incidence collector. Radiation passed by collector 50 is reflected off a grating spectral filter 51 to be focused in a virtual source point 52 at an aperture in the collector chamber 48. From collector chamber 48, a radiation beam 56 is reflected in illumination optics unit 44 via normal incidence reflectors 53, 54 onto a patterning device (e.g. reticle or mask) positioned on patterning device support (e.g. reticle or mask table) MT. A patterned beam 57 is formed which is imaged in projection system PL via reflective elements 58, 59 onto wafer stage or substrate table WT. More elements than shown may generally be present in illumination optics unit 44 and projection system PL.

The radiation collector 50 may be a collector as described in European patent application no. 03077675.1, which is incorporated herein by reference.

Alternatively, in other embodiments, the radiation collector is one or more of a collector configured to focus collected radiation into the radiation beam emission aperture; a collector having a first focal point that coincides with the source and a second focal point that coincides with the radiation beam emission aperture; a normal incidence collector; a collector having a single substantially ellipsoid radiation collecting surface section; and a Schwarzschild collector having two radiation collecting surfaces.

Also, in another embodiment, the radiation source SO may be a laser produced plasma (LPP) source including a light source that is configured to focus a beam of coherent light, of a predetermined wavelength, onto a fuel.

For example, FIG. 3 shows an embodiment of a radiation system 42, in cross-section, including a normal incidence collector 70. The collector 70 has an elliptical configuration, having two natural ellipse focus points F1, F2. Particularly, the normal incidence collector includes a collector having a single radiation collecting surface 70s having the geometry of the section of an ellipsoid. In other words: the ellipsoid radiation collecting surface section extends along a virtual ellipsoid (part of which is depicted by as dotted line E in the drawing).

As will be appreciated by the skilled person, in case the collector mirror 70 is ellipsoidal (i.e., including a reflection surface 70s that extends along an ellipsoid), it focuses radiation from one focal point F1 into another focal point F2. The focal points are located on the long axis of the ellipsoid at a distance $f=(a2-b2)^{1/2}$ from the center of the ellipse, where 2a and 2b are the lengths of the major and minor axes, respectively. In case that the embodiment shown in FIG. 1 includes an LPP radiation source SO, the collector may be a single ellipsoidal mirror as shown in FIG. 3, where the light source SO is positioned in one focal point (F1) and an intermediate focus IF is established in the other focal point (F2) of the mirror. Radiation emanating from the radiation source, located in the first focal point (F1) towards the reflecting surface 70s and the reflected radiation, reflected by that surface towards the second focus point F2, is depicted by lines r in the drawing. For example, according to an embodiment, a mentioned intermediate focus IF may be located between the collector and an illumination system IL (see FIGS. 1, 2) of a lithographic apparatus, or be located in the illumination system IL, if desired.

The radiation source is preferably a source that is associated with a laser source configured to generate a laser beam of coherent light, having a predetermined wavelength. The laser light is focused onto a fuel source (the fuel for example being supplied by a fuel supplier, and for example including fuel droplets, for example tin droplets) to generate radiation therefrom, in a laser produced plasma process. The resulting radiation may be EUV radiation, in this embodiment. In a non-limiting embodiment, the predetermined wavelength of the laser light is 10.6 microns (i.e. μm). For example, the fuel may be tin (Sn), or a different type of fuel, as will be appreciated by the skilled person.

Figure 4:
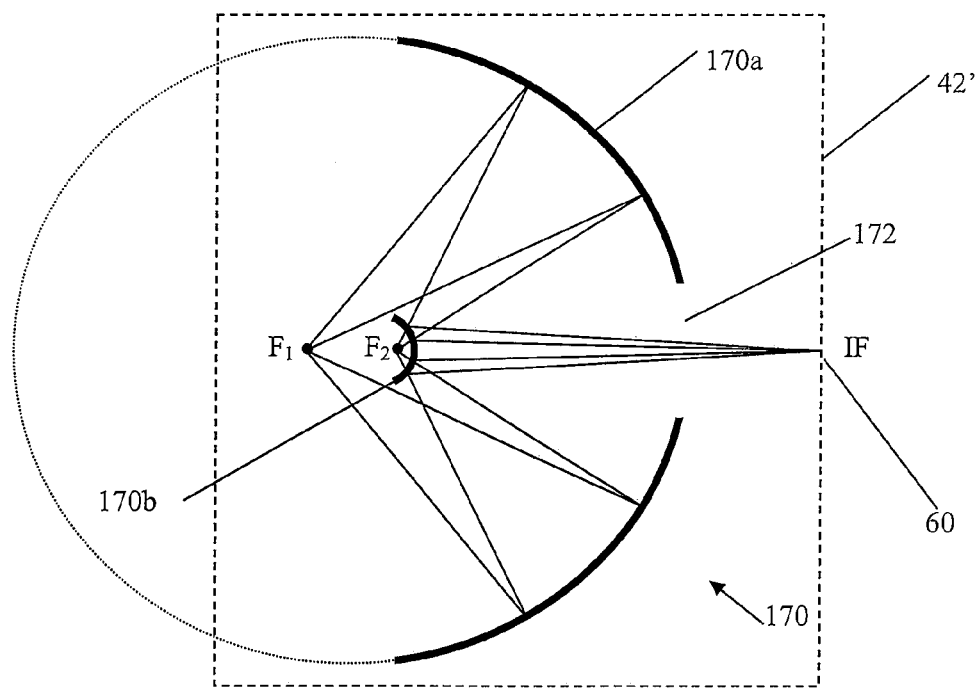
FIG. 4 depicts a radiation source and a Schwarzschild type normal incidence collector in accordance with an embodiment of the invention.

FIG. 4 schematically shows a radiation source unit 42' in accordance with an embodiment of the invention, in cross-section, including a collector 170. In this case, the collector includes two normal incidence collector parts 170a, 170b, each part 170a, 170b preferably (but not necessarily) having a substantially ellipsoid radiation collecting surface section. Particularly, the embodiment of FIG. 4 includes a Schwarzschild collector design, preferably consisting of two mirrors 170a, 170b. The source SO may be located in a first focal point F1. For example, the first collector mirror part 170a may have a concave reflecting surface (for example of ellipsoid or parabolic shape) that is configured to focus radiation emanating from the first focal point F1 towards the second collector mirror part 170b, particularly towards a second focus point F2. The second mirror part 170b may be configured to focus the radiation that is directed by the first mirror part 170a towards the second focus point F2, towards a further focus point IF (for example an intermediate focus). The first mirror part 170a includes an aperture 172 via which the radiation (reflected by the second mirror 170b) may be transmitted towards the further focus point IF. For example, the embodiment of FIG. 4 may beneficially be used in combination with a DPP radiation source.

The radiation collector 70 may be configured to collect radiation generated by the source, and to focus collected radiation to the downstream radiation beam emission aperture 60 of the radiation system 42.

For example, the source SO may be configured to emit diverging radiation, and the collector 70 may be arranged to reflect that diverging radiation to provide a converging radiation beam, converging towards the emission aperture 60 (as in FIGS. 3 and 4). Particularly, the collector 70 may focus the radiation onto a focal point IF on an optical axis O of the system (see FIG. 2), which focal point IF is located in the emission aperture 60.

The emission aperture 60 may be a circular aperture, or have another shape (for example elliptical, square, or another shape). The emission aperture 60 is preferably small, for example having a diameter less than about 10 cm, preferably less than 1 cm, (measured in a direction transversally with a radiation transmission direction T, for example in a radial direction in case the aperture 60 has a circular cross-section). Preferably, the optical axis O extends centrally through the aperture 60, however, this is not essential.

Tin (or other elements) produced by the EUV radiation source SO may contaminate various optical elements of the collector chamber 48. For example, contamination particles may deposit on the EUV collectors 70 (FIG. 3) and 170 (FIG. 4). In order to achieve sufficient lifetime for the EUV lithography apparatus 1, it is desirable to remove tin from the EUV collector mirror 70 and 170.

United States patent application publication no. 2006/0115771 describes the use of such a capping layer to protect various optical elements. With such a process, it may be possible fully to clean a multi-layer optical element with Ru-top, Mo-top or Si-top, using hydrogen plasma. United States patent application publication no. 2007/0040999 describes the use of a gas containing $H_2$ and one or more hydrocarbons or silanes to clean a capped mirror. However, the use of a capping layer may not be possible for use with laser-produced plasma (LPP) sources because the multilayer is etched away during operation thereby exposing new layers.

Mo has similar properties to Ru. For example, both have a very high hydrogen recombination rate. It is therefore expected to be difficult to clean Mo using $H_2$ radicals, without the use of a capping layer, because that is what has been found with Ru (see United States patent application publication no. 2006/0115771).

Another potential problem that may arise with the use of hydrogen radicals to remove Sn deposits is that the Sn hydrides formed are relatively unstable and tend redeposit on the surface of the substrate. This may reduce the overall cleaning rate and may be a particular problem when a laser-produced plasma (LPP) source is used, since the LPP source produces a large number of hydrogen radicals that can remove Sn from areas other than the collector mirror and redeposit this Sn on the collector mirror.

In an embodiment of the invention, hydrogen radicals may be applied to remove tin and other contamination from the optical elements. Hydrogen radicals may be created by dissociating a gas containing $H_2$ using a hot filament. Parts of the hydrogen radicals may then be applied to the surface of the optical element in order to remove the tin contamination. Additional information regarding cleaning of optical elements with hydrogen radicals may be gleaned from United States patent application publication no. 2006/0115771, the entire content of which is incorporated herein by reference.

A cleaning rate greater than about 1 nm/sec with hydrogen radicals may be obtained when Sn contamination is deposited on a silicon substrate. It will be appreciated that the cleaning rate may substantially vary depending on the thickness of the contamination layer and the substrate. For example, when using a very thick layer of tin, the cleaning rate may be much lower. Further, experiments on Ru substrates have shown that the cleaning rate is even lower and full cleaning (i.e. all Sn removed from the Ru substrate) may not be possible in certain circumstances.

One option that may be pursued to fully remove Sn contamination on a Ru substrate and/or to fully remove thick layers of Sn contamination is to add a cleaning cap layer to a multi-layer mirror surface. United States patent application publication no. 2006/0115771, incorporated by reference, generally describes the use of such a capping layer to protect various optical elements. The cap layer is configured to act as a protection layer that may be removed after operation of the optical elements. During operation of the lithographic apparatus, Sn may deposit on at least part of the cap layer or damage and remove at least part of the cap layer. After use of the optical element, the cap layer may be removed and replaced with a fresh cap layer. Hydrogen radicals may be applied to remove Sn from multi-layer mirrors with varying capping layers. With this process, it may be possible to fully clean a multi-layer optical element with Mo-top or Si-top, although the cleaning rate with hydrogen radicals for thin Sn layers may be substantially reduced.

The fact that hydrogen radicals may be used to clean Sn contamination from both Mo and Si surfaces makes hydrogen a prime candidate for cleaning collectors in laser-produced plasma (LPP) sources. These sources are commonly equipped with a normal-incidence multilayer collector. However, the use of a cleaning cap layer may not be possible in LLP sources since the multilayer is etched away during operation. It is currently envisioned that the collector may initially have about 500 multilayer periods.

Hydrogen cleaning may replace other (online) cleaning methods for collectors in LPP sources, such as HBr or other halogen hydrides. While hydrogen cleaning has several benefits, e.g. the chemistry is less aggressive and the hydrogen may additionally clean carbon contamination from the mirror, it is desirable to increase the cleaning rate of the optical element (i.e. the removal rate of Sn contamination) to ensure that the rate at which Sn is removed from the surface of the optical element is higher than the Sn deposition rate.

In one embodiment of the invention, it is proposed to increase the cleaning rate of optical elements that do not include a cap layer by adding a small concentration of a hydrocarbon (e.g. methane) to the cleaning gas. It was discovered that the use of a small concentration of a hydrocarbon (e.g. methane) may significantly increase the cleaning rate of contaminated surfaces. For example, in one embodiment, the use of methane may increase the cleaning rate by typically up to one order of magnitude.

Figure 5:
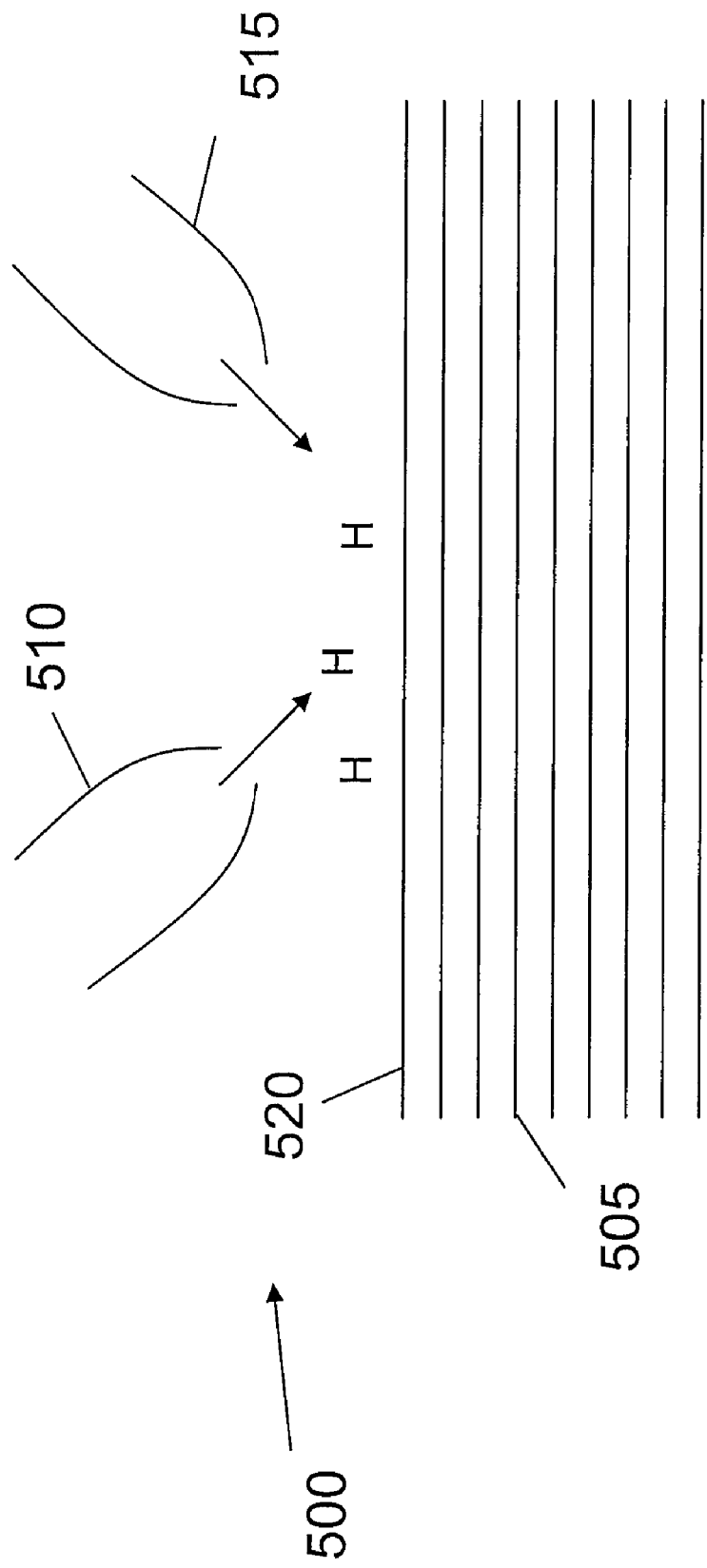
FIG. 5 depicts a cleaning apparatus in accordance with an embodiment of the invention.

Referring now to FIG. 5, this figure shows a cleaning apparatus 500 in accordance with an embodiment of the invention. The cleaning apparatus 500 is configured to clean Sn from an uncapped multilayer mirror 505. The uncapped multilayer mirror 505 may be an uncapped Mo/Si normal-incidence collector mirror. As shown in FIG. 5, the cleaning apparatus 500 includes a first nozzle or outlet 510 configured to supply a flow of hydrogen radicals and a second nozzle or outlet 515 configured to supply a flow of at least a hydrocarbon or silane gas. Both the hydrogen radicals and the hydrocarbon and/or silane gas are supplied to the upper surface 520 of the mirror 505 in order to remove the contamination particles. In an embodiment of the invention, the second nozzle 515 is configured to supply methane.

In an embodiment of the invention, the first nozzle 510, which is configured to supply hydrogen radicals, is located close to the source. The hydrogen radicals may be produced, for example, by a hot filament, an RF discharge, or photo-dissociation. In this latter configuration, EUV radiation emitted by the source may be used to photo-dissociate hydrogen to produce hydrogen radicals. In an LPP source, the hydrogen radicals may also be generated by the focused pump laser beam, or by the laser produced plasma. Alternatively, it may also be possible to generate hydrogen radicals using a focused laser beam separate from the LPP EUV source setup.

In an embodiment, the second nozzle 515 is located at a position proximate that of the first nozzle 510. Alternatively, it is contemplated that both gases be supplied through the same nozzle. In this latter embodiment, the hydrocarbon or silane may be dissociated (or decomposed) by the same device that dissociates the hydrogen to produce hydrogen radicals (e.g. hot filament, etc.).

Since a high hydrocarbon or silane pressure at the source may be detrimental to plasma formation and since hydrocarbon or silane may not diffuse fast enough from the gas outlet to the collector surface (hydrogen has a higher diffusion rate than hydrocarbons or silanes), the second nozzle 515 that supplies hydrocarbon or silane may be arranged proximate the collector surface. In an embodiment, one or more hydrocarbon or silane nozzles or outlets are provided through the collector surface. In these embodiments, it may be beneficial to separately decompose hydrocarbon or silane for each nozzle, e.g. using the devices described above (hot filament etc.).

In an embodiment of the invention, the outlets for both hydrogen and hydrocarbon or silane may be provided close to the collector surface. In an embodiment, the hydrocarbon is methane.

By adding $CH_4$ to the hydrogen containing gas during cleaning, the cleaning rate may be advantageously increased relative to a cleaning process under the same conditions but with only hydrogen. When, for example, $CH_4$ is added to the hydrogen gas in an embodiment, the hot filament will dissociate $CH_4$ molecules in addition to the $H_2$ molecules (i.e. at least part of the gases will produce hydrocarbon and hydrogen radicals; and hydrogen radical generator is also a hydrocarbon radical generator). The resulting radicals will be H radicals and e.g. $CH_3$ radicals. The ratio between these radicals can be tuned by e.g. changing the relative gas flows of hydrogen containing gas and the hydrocarbon compound containing gas $CH_4$ or by tuning the molecular ratios in the mixed gas. The person skilled in the art will tune the ratio such that the ratio is not too low or too high. For example, if there are too many $CH_3$ radicals, there may be a high risk of forming a thick layer of carbon on the substrate (in addition to a desired carbonizing effect). Therefore, the $CH_3$ concentration should be low enough to allow the H radicals to remove the carbon deposits faster than they are growing. However, if the $CH_3$ concentration is too low, the effect of the $CH_4$ addition will be too low.

The cleaning rate of uncapped multilayer mirrors may be increased by use of a cleaning gas comprising one or more of $H_2$, $D_2$ and HD, and one or more additional compounds selected from hydrocarbon compounds and/or silane compounds. It is surprising that a mirror comprising Mo can be cleaned in this way, since Mo is expected to behave like Ru. The addition of one or more hydrocarbon compounds or silane compounds significantly increases the cleaning rate of contaminated surfaces. For example, the addition of one or more hydrocarbon compounds or silane compounds may increase the cleaning rate by typically up to one order of magnitude.

The mechanism with which the hydrocarbon radicals can improve the cleaning rate may be the following: in the gas-phase the hydrocarbon radicals, e.g. $CH_3$ radicals, can react with the $SnH_4$ (tin-hydride) molecules to form $SnH_3(CH_3)$, $SnH_2(CH_3)_2$, $SnH(CH_3)_3$, or $Sn(CH_3)_4$. These molecules are more stable than the $SnH_4$ molecule and therefore the cleaning rate will improve, since these molecules have a lower chance of forming an Sn redeposition on the mirror.

If the gas comprises one or more of $D_2$ or HD and one or more additional compounds selected from hydrocarbon compounds and/or silane, then deuterium radicals will be produced when the gas is dissociated. Deuterium radicals will behave in the same way as hydrogen radicals, and any reference above or below to the properties and reactions of hydrogen radicals applies equally to deuterium radicals. Similarly, the properties and reactions of deuterated tin hydrides (for example $SnDH_3$, $SnD_4$ or $SnDH_2(CH_3)$) will similar to the undeuterated versions.

It is desired that the cleaning gas comprises $H_2$ and one or more additional compounds selected from hydrocarbon compounds and/or silane compounds.

This feature may be particularly important if a laser-produced-plasma (LPP) source is used, since the LPP source produces hydrogen radicals which remove Sn from areas other than the collector mirror. This Sn may then be redeposited on the collector mirror. However, the hydrocarbon radicals such as $CH_3$ radicals can react with the $SnH_4$ before it is redeposited on the collector mirror, forming the more stable compounds outline above. These can then be more easily and efficiently transported out of the apparatus.

In an embodiment of the invention, the hydrocarbon compound includes a $C_1$-$C_{25}$ compound. In an embodiment, the hydrocarbon compound includes a linear, a branched, a cyclic or an aromatic hydrocarbon, e.g. methane, ethane, n-propane, n-butane, n-propane, n-hexane, and isomers thereof like cyclopropane, cyclo butane, tert butane (iso-butane or 2-methyl propane), cyclo pentane, iso-pentane (or 2-methylbutane), neo-pentane (or 2,2-dimethylpropane) etc. In an embodiment, the hydrocarbon compound is selected from methane, ethane, n-propane, n-butane, n-propane, n-hexane, cyclo butane, tert butane (iso-butane), iso-pentane, neo-pentane, and mixtures of one or more of these compounds. Further, the hydrocarbon compound may have one or more unsaturated bonds, i.e. an alkene, alkyne or aromatic. Combinations of one or more of these hydrocarbon compounds may also be used.

In an embodiment, the hydrocarbon compound includes a $R_1R_2R_3CR_4$ compound, wherein $R_1$, $R_2$, $R_3$ and $R_4$ (side chains) independently are selected from the group of $C_1$-$C_6$ hydrocarbon groups, i.e. a carbon atom is coordinated by 4 hydrocarbon groups, which may be independently of each other linear, branched, cyclic or aromatic, e.g. in an embodiment $C(CH_3)_4$, $C(CH_2CH_3)_4$, $C(CH_2CH_2CH_3)_4$, $C(CH_2CH_2CH_2CH_3)_4$, etc. but also in an embodiment e.g. $C(CH_3)(CH_2CH_2CH_3)_3$, etc. The side chains may also include in an embodiment isomers of these hydrocarbon groups, for example those defined above. The side chains may also include unsaturated hydrocarbon groups. The side chains may also be different (independently chosen), and may be linear, branched or cyclic.

In an embodiment, the hydrocarbon compound includes a $R_1R_2R_3CR_4$ compound, wherein $R_1$, $R_2$, $R_3$ and $R_4$ independently are selected from the group of $C_1$-$C_6$ hydrocarbon groups and a hydrogen group, and wherein at least one of $R_1$, $R_2$, $R_3$ and $R_4$ includes a hydrogen group. In an embodiment, the hydrocarbon compound is selected from $HCR_1R_2R_3$, wherein $R_1$, $R_2$, and $R_3$ independently are selected from the group of $C_1$-$C_6$ hydrocarbon groups, like $CH(CH_3)_3$ (trimethylmethane), $CH(CH_2CH_3)_3$ (triethylmethane), $CH(CH_2CH_2CH_3)_3$ (tripropylmethane), $CH(CH_2CH_2CH_2CH_3)_3$ (tributylmethane), $CH(CH_2CH_2CH_2CH_2CH_3)_3$ (tripentylmethane) and $CH(CH_2CH_2CH_2CH_2CH_2CH_3)_3$ (trihexylmethane). In an embodiment, the hydrocarbon compound is selected from the group of methane, toluene and $R_1R_2R_3CH$, wherein $R_1$, $R_2$, and $R_3$ independently are selected from the group of $C_1$-$C_4$ hydrocarbon groups, which may be linear, branched or cyclic, like e.g. $CH(CH_3)_3$ (trimethylmethane), $CH(CH_2CH_3)_3$ (triethylmethane), $CH(CH_2CH_2CH_3)_3$ (tripropylmethane), $CH(CH_2CH_2CH_2CH_3)_3$ (tributylmethane). Like above, the side chains may also include in an embodiment isomers of these hydrocarbon groups, for example those defined above. The side chains may also include unsaturated hydrocarbon groups. The side chains may also be different, and may be linear, branched or cyclic.

In an embodiment, the hydrocarbon compound includes an aromatic compound, substituted with at least one $C_1$-$C_6$ hydrocarbon group, which may be linear, branched, cyclic or aromatic.

Instead of a hydrocarbon compound or in addition to the hydrocarbon compound, also a silane compound may be used. Both compounds may provide a function similar to a catalyst in the sense that the removal rate of the deposition by treatment with hydrogen radicals is increased. In an embodiment, the silane compound includes a $R_1R_2R_3SiR_4$ compound, wherein $R_1$, $R_2$, $R_3$ and $R_4$ independently are selected from the group of $C_1$-$C_6$ hydrocarbon groups, i.e. a silicon atom is coordinated by 4 hydrocarbon groups, which may be independently of each other linear, branched, cyclic or aromatic, like e.g. in an embodiment $Si(CH_3)_4$, $Si(CH_2CH_3)_4$, $Si(CH_2CH_2CH_3)_4$, $Si(CH_2CH_2CH_2CH_3)_4$, etc., but also in an embodiment $Si(CH_3)(CH_2CH_2CH_3)_3$, etc. Like above, the side chains may also include in an embodiment isomers of these hydrocarbon groups, for example those defined above. The side chains may also include unsaturated hydrocarbon groups. The side chains may also be different, and may be linear, branched or cyclic.

In an embodiment, the silane compound includes a $R_1R_2R_3SiR_4$ compound, wherein $R_1$, $R_2$, $R_3$ and $R_4$ independently are selected from the group of $C_1$-$C_6$ hydrocarbon groups and a hydrogen group, wherein at least one of $R_1$, $R_2$, $R_3$ and $R_4$ includes hydrogen, i.e. a silicon atom is coordinated by 3 or less hydrocarbon groups, which may be independently of each other linear, branched, cyclic or aromatic (e.g. tri or di methyl silane). The hydrocarbon side chains may have one or more unsaturated bonds, i.e. an alkene, alkyne or aromatic. In an embodiment, the hydrocarbon compound is selected from $HSiR_1R_2R_3$, wherein $R_1$, $R_2$, and $R_3$ independently are selected from the group of $C_1$-$C_6$ hydrocarbon groups, like SiH(CH$_3$)$_3$ (trimethylsilane), SiH(CH$_2$CH$_3$)$_3$ (triethylsilane), SiH(CH$_2$CH$_2$CH$_3$)$_3$ (tripropylsilane), SiH(CH$_2$CH$_2$CH$_2$CH$_3$)$_3$ (tributylsilane), SiH(CH$_2$CH$_2$CH$_2$CH$_2$CH$_3$)$_3$ (tripentylsilane) and SiH(CH$_2$CH$_2$CH$_2$CH$_2$CH$_2$CH$_3$)$_3$ (trihexylsilane). In an embodiment, the silane compound is selected from the group of R$_1$R$_2$R$_3$CH, wherein R$_1$, R$_2$, and R$_3$ independently are selected from the group of C$_1$-C$_4$ hydrocarbon groups, which may be linear, branched or cyclic, like e.g. SiH(CH$_3$)$_4$ (trimethylsilane), SiH(CH$_2$CH$_3$)$_4$ (triethylsilane), SiH(CH$_2$CH$_2$CH$_3$)$_4$ (tripropylsilane), SiH(CH$_2$CH$_2$CH$_2$CH$_3$)$_4$ (tributylsilane). Like above, the side chains may also include in an embodiment isomers of these hydrocarbon groups, for example those defined above. The side chains may also include unsaturated hydrocarbon groups. The side chains may also be different, and may be linear, branched or cyclic. In another embodiment, the silane includes a polysilane.

In an embodiment, the C$_1$-C$_{25}$ compound, the C$_1$-C$_6$ hydrocarbon side groups or the C$_1$-C$_4$ hydrocarbon side groups for either the hydrocarbon or the silane compound may include one or more selected from the group of alkoxy groups (e.g. alkylalkoxysilane), alcohol groups and halide groups. As will be clear to the person skilled in the art, combinations of gases can be used.

In an embodiment, the side chains mentioned above may include isomers of the hydrocarbon groups. The side chains may also include unsaturated hydrocarbon groups. The side chains may also be different (within one compound, e.g. ethyl dimethyl silane: (CH$_3$CH$_2$)SiH(CH$_3$)$_2$, etc.) and may be linear, branched or cyclic.

In an embodiment, the silane compound includes one or more compounds selected from the group of Si$_n$H$_{2n+2}$, wherein n is an integer of 1 or larger.

The hydrocarbon compounds and silane compounds described above may contain one or more deuterium atoms.

The method according to an embodiment of the invention includes producing radicals from the one or more additional compounds selected from the group of hydrocarbon compounds and silane compounds. For example, CH$_3$ may be formed from CH$_4$, tert butyl methane or from tert methyl silane (CH$_3$)$_3$SiH, etc. According to an embodiment, the method according to the invention further includes producing hydrocarbon radicals from the one or more additional compounds selected from the group of hydrocarbon compounds and silane compounds. To this end, in an embodiment, the apparatus further includes a hydrocarbon radical generator configured to generate hydrocarbon radicals from the one or more additional compounds. In an embodiment, this hydrocarbon radical generator may be the same generator as used for generation hydrogen radicals, i.e. one or more radical formation devices selected from a hot filament, a plasma, radiation; and/or a catalyst for converting the silane into hydrocarbon radicals.

Likewise, in an embodiment, the apparatus further includes a radical generator configured to generate radicals from the one or more the silane compounds selected from the group of Si$_n$H$_{2n+2}$, wherein n is an integer of 1 or larger. In an embodiment, this radical generator may be the same generator as used for the generation of hydrogen radicals or of hydrocarbon radicals, as described above, i.e. one or more radical formation devices selected from a hot filament, a plasma, radiation; and/or a catalyst for converting the silane compound into radicals.

The concentration of hydrocarbon compounds and silane compounds in the gas is preferably about 1% or greater, more preferably about 5% or greater. In an embodiment, the concentration of hydrocarbon compounds and silane compounds in the gas is in a range from about 1% to about 8%, more preferably from about 5% to about 8%.

Figure 6:
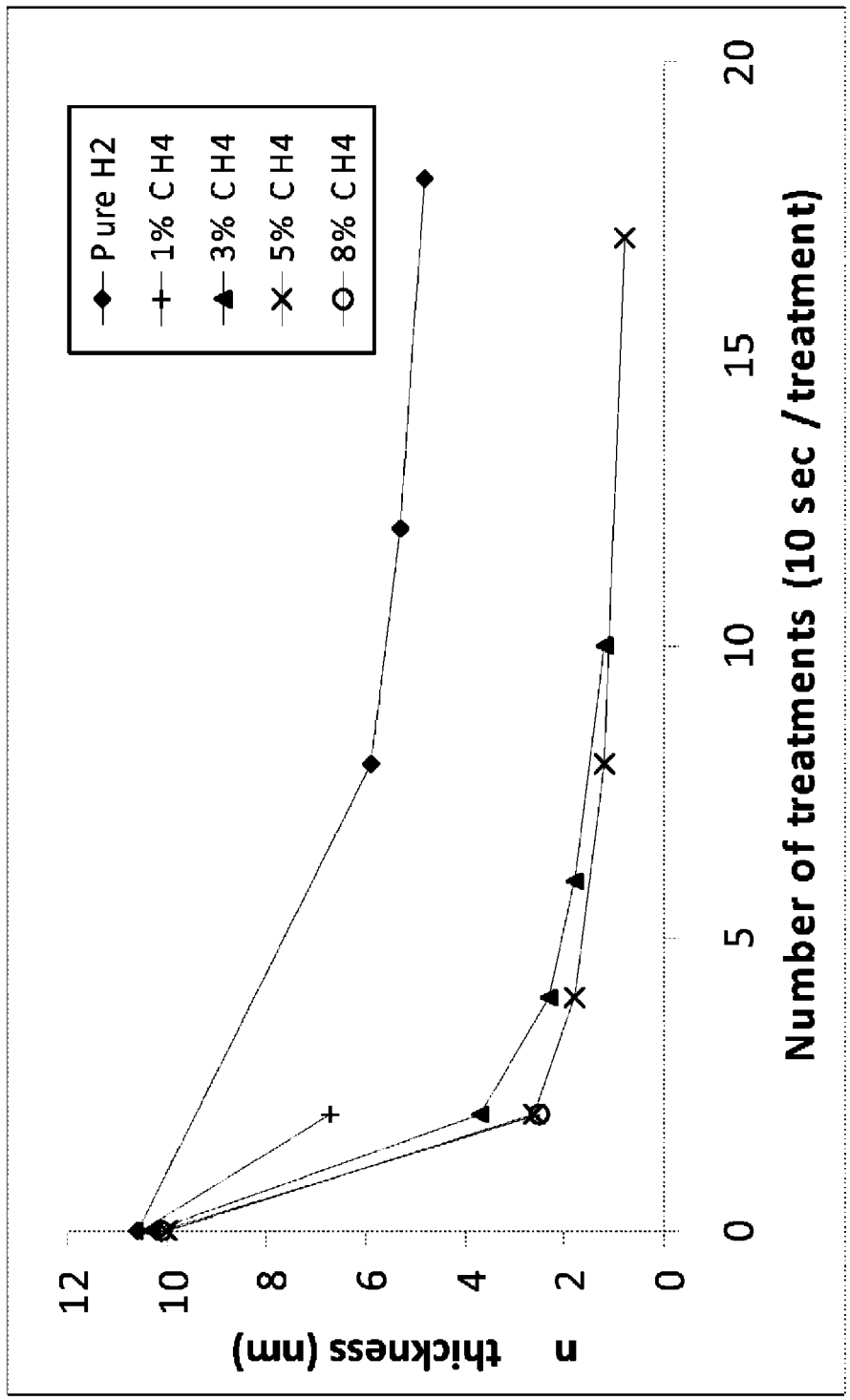
FIG. 6 depicts cleaning rates for hydrogen with varying concentration of methane in accordance with an embodiment of the invention.

FIG. 6 generally shows the cleaning rate of a Sn contaminated surface for various concentrations of methane. Specifically, FIG. 6 shows the Sn layer thickness as a function of cleaning treatment for five cleaning processes: (1) a cleaning process including only hydrogen, (2) a cleaning process including hydrogen with a 1% CH$_4$ concentration, (3) a cleaning process including hydrogen with a 3% CH$_4$ concentration, (4) a cleaning process including hydrogen with a 5% CH$_4$ concentration and (5) a cleaning process including hydrogen with a 8% CH$_4$ concentration. In this embodiment, hydrogen and methane were supplied through the same nozzle and dissociated by the same device. During each treatment, the surface 520 of the mirror 505 was exposed to hydrogen radicals for about 10 seconds.

As can be seen in FIG. 6, the addition of a small concentration of methane substantially removes Sn contamination after only 2 treatments. For example, with a gas mixture including 5% of methane, it is possible to remove about 80% of Sn from the surface of the mirror.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention is not limited to application of the lithographic apparatus or use in the lithographic apparatus as described in the embodiments. Further, the drawings usually only include the elements and features that are necessary to understand the invention. Beyond that, the drawings of the lithographic apparatus are schematically and not on scale. The invention is not limited to those elements, shown in the schematic drawings (e.g. the number of mirrors drawn in the schematic drawings). Further, the invention is not confined to the lithographic apparatus described in FIGS. 1 and 2. The person skilled in the art will understand that embodiments described above may be combined. Further, the invention is not limited to protection against, for example Sn from a source SO, but also other particles from other sources, such as radiation sources that may damage optical element, may be removed.

What is claimed is:

1. A method for removal of a deposition on an uncapped Mo/Si multilayer mirror of an apparatus, the method comprising:
    providing a gas comprising one or more of $H_2$, $D_2$ and HD, and one or more additional compounds selected from hydrocarbon compounds and/or silane compounds in at least part of the apparatus;
    producing hydrogen and/or deuterium radicals and radicals of the one or more additional compounds, from the gas; and
    bringing the uncapped Mo/Si multilayer mirror with deposition into contact with at least part of the hydrogen and/or deuterium radicals and radicals of the one or more additional compounds to remove at least part of the deposition.

2. The method according to claim 1, wherein:
    said providing comprises providing a gas comprising $H_2$ and one or more additional compounds selected from hydrocarbon compounds and/or silane compounds;
    said producing comprises producing hydrogen radicals and radicals of the one or more additional compounds; and
    said bringing comprises bringing the uncapped Mo/Si multilayer mirror into contact with at least part of the hydrogen radicals and radicals of the one or more additional compounds.

3. The method according to claim 1, wherein the radicals from the one or more additional compounds are hydrocarbon radicals.

4. The method according to claim 1, wherein the radicals are produced by a hot filament, RF discharge or dissociation or photodissociation.

5. The method according to claim 1, wherein the uncapped Mo/Si multilayer mirror with deposition into contact with at least part of the hydrogen and/or deuterium radicals and radicals of the one or more additional compounds comprises bringing at least one layer of a repeating unit of said uncapped Mo/Si multilayer mirror into contact with at least part of the hydrogen and/or deuterium radicals and radicals of the one or more additional compounds.

6. The method according to claim 1, wherein the at least part of the deposition is removed ex situ from the apparatus.

7. The method according to claim 1, wherein the hydrocarbon compound comprises a $C_1$-$C_{25}$ compound.

8. The method according to claim 1, wherein the hydrocarbon compounds and silane compounds contain one or more deuterium atoms.

9. A method according to claim 8, wherein:
    said providing comprises providing a gas comprising $H_2$ and one or more additional compounds selected from hydrocarbon compounds and/or silane compounds;
    said producing comprises, producing hydrogen radicals and radicals of the one or more additional compounds; and
    said bringing comprises bringing the uncapped Mo/Si multilayer mirror into contact with at least part of the hydrogen radicals and radicals of the one or more additional compounds.

10. A device manufacturing method comprising:
    conditioning a radiation beam using a radiation system, the radiation system including at least one uncapped Mo/Si multilayer mirror;
    patterning the radiation beam with a desired pattern to form a patterned beam of radiation;
    projecting the patterned beam of radiation onto a substrate; and
    during or after the conditioning, removing a deposition comprising Sn on the at least one uncapped Mo/Si multilayer mirror, the removing comprising:
        providing a gas comprising one or more of $H_2$, $D_2$ and HD and one or more additional compounds selected from hydrocarbon compounds and/or silane compounds;
        producing hydrogen and/or deuterium radicals and radicals of the one or more additional compounds, from the gas; and
        bringing the uncapped Mo/Si multilayer mirror with deposition into contact with at least part of the hydrogen and/or deuterium radicals and radicals of the one or more additional compounds to remove at least part of the deposition.

* * * * *

UNITED STATES PATENT AND TRADEMARK OFFICE
CERTIFICATE OF CORRECTION

| | | |
|---|---|---|
| PATENT NO. | : 8,405,051 B2 | Page 1 of 1 |
| APPLICATION NO. | : 12/997149 | |
| DATED | : March 26, 2013 | |
| INVENTOR(S) | : Vadim Yevgenyevich Banine et al. | |

It is certified that error appears in the above-identified patent and that said Letters Patent is hereby corrected as shown below:

On title page, item (56) References Cited - FOREIGN PATENT DOCUMENTS, first reference
      replace "10 2005 03232"
      with --10 2005 032320--.

Signed and Sealed this
Fourth Day of June, 2013

Teresa Stanek Rea
*Acting Director of the United States Patent and Trademark Office*